US008729696B2

(12) United States Patent
Lee et al.

(10) Patent No.: US 8,729,696 B2
(45) Date of Patent: May 20, 2014

(54) TESTING DEVICE FOR LASER DIODE

(75) Inventors: Bing-Heng Lee, New Taipei (TW);
Kuo-Fong Tseng, New Taipei (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 0 days.

(21) Appl. No.: 13/534,192

(22) Filed: Jun. 27, 2012

(65) Prior Publication Data

US 2013/0236992 A1    Sep. 12, 2013

(30) Foreign Application Priority Data

Mar. 6, 2012 (TW) .............................. 101107423 A

(51) Int. Cl.
*H01L 23/12* (2006.01)
*G01R 31/02* (2006.01)
*G01R 31/00* (2006.01)
*G06F 19/00* (2011.01)

(52) U.S. Cl.
USPC .............. 257/711; 257/E21.526; 324/762.07; 702/58

(58) Field of Classification Search
USPC ........ 257/711, E21.526; 385/90; 324/762.07; 702/58
See application file for complete search history.

(56) References Cited

U.S. PATENT DOCUMENTS

2003/0011357 A1* 1/2003 Hu et al. .................... 324/158.1
* cited by examiner

*Primary Examiner* — David S Blum
(74) *Attorney, Agent, or Firm* — Novak Druce Connolly Bove + Quigg LLP

(57) ABSTRACT

In a testing method for an LD, an LD die is held. Then, electric current increasing with a fixed increment and having a sequence of current values is supplied to the LD die to drive the LD die to emit light and a sequence of voltage values across the LD die and corresponding to the sequence of current values, respectively, is metered. A sequence of power values corresponding to the sequence of current values, respectively, is also metered. Next, an electro-optical property of the LD die is determined according to the sequence of current values, the sequence of voltage values, and the sequence of power values. Finally, if the LD die is determined to be qualified based upon the electro-optical property of the LD die, the LD die is packaged into the LD.

3 Claims, 3 Drawing Sheets

TESTING DEVICE FOR LASER DIODE

BACKGROUND

1. Technical Field

The present disclosure relates to laser diodes (LDs) and, particularly, to a testing method, testing device, and manufacturing method for an LD.

2. Description of Related Art

LDs include an LD die and a package packaging the LD die. An electro-optical conversion property of the LD, which determines whether or not the LD is qualified, mainly depends on an electro-optical conversion property of the LD die. However, a quality of the LD is typically tested after being packaged. As such, unqualified LD dies cannot be avoided from being packaged, which wastes time and materials.

Therefore, it is desirable to provide a testing method, testing device, and manufacturing method for an LD, which can overcome the above-mentioned shortcomings.

DETAILED DESCRIPTION

Embodiments of the disclosure will be described in detail, with reference to the accompanying drawings.

Figure 1:
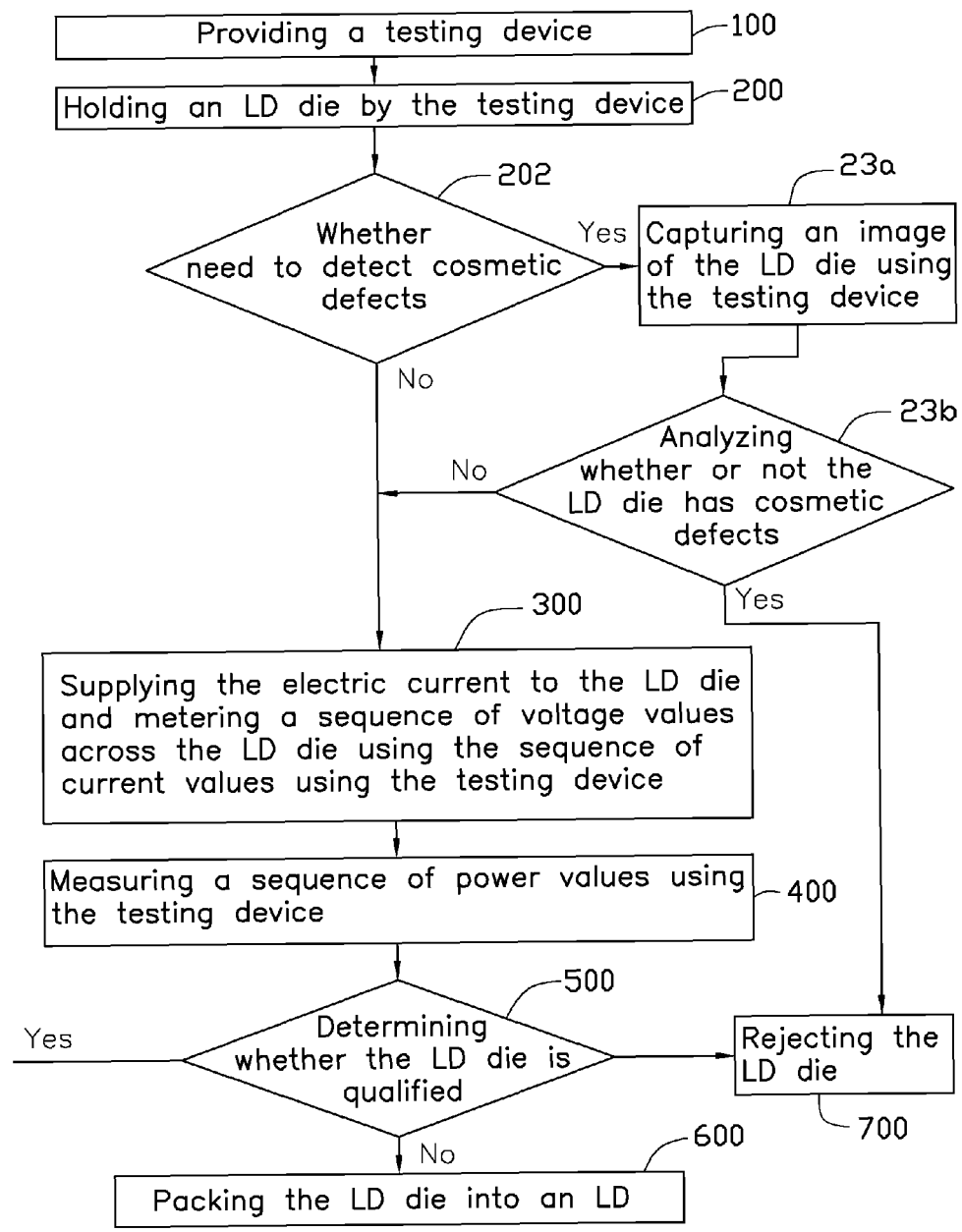
FIG. 1 is a flow chart of a manufacturing method for an LD according to an embodiment.
Figure 2:
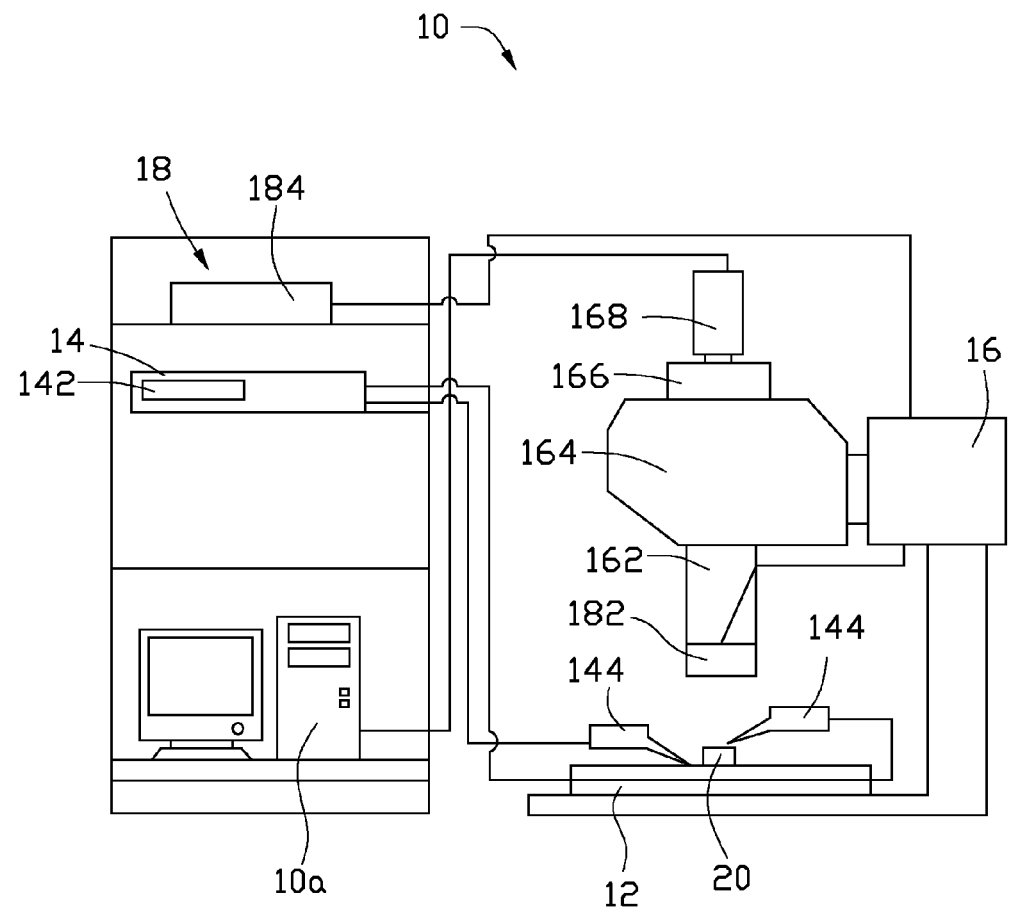
FIG. 2 is a schematic view of a testing device for an LD according to the embodiment.
Figure 3:
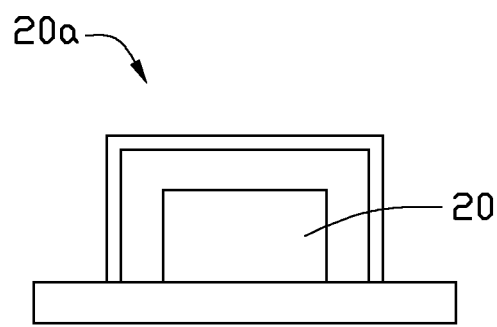
FIG. 3 is a schematic view of an LD according to the embodiment.

FIGS. 1-2, illustrate a manufacturing method for an LD 20a (see FIG. 3), according to an embodiment. The manufacturing method includes the following steps 100-600.

In step 100, providing a testing device 10. The testing device 10 includes a chuck 12, a current source 14, a support 16, and an optical power meter 18. The current source 14 is configured for supplying electric current increasing with a fixed increment and has a voltage meter 142. That is, the electric current has a sequence of current values. The support 16 is positioned on the chuck 12 and includes a first cantilever 162 extending above the chuck 12. The optical power meter 18 includes a photo detector 182 and a power meter 184. The photo detector 182 is positioned on the first cantilever 162, facing the chuck 12. The power meter 184 is electrically connected to the photo detector 182.

In step 200, placing and holding an LD die 20 in the chuck 12, directly facing the photo detector 182. The support 16 can further include a rotary plate 164. The first cantilever 162 extends from the rotary plate 164. The photo detector 182 can be positioned to directly face the LD die 20 by rotation of the rotary plate 164.

In step 202, determining whether cosmetic defects of the LD die 20 need to be detected.

In step 300, supplying the electric current to the LD die 20 to drive the LD die 20 to emit light. If it is determined that the cosmetic defects of the LD die 20 do not need to be detected, the current source 14 supplies the electric current to the LD die 20. The voltage meter 142 measures a sequence of voltage values across the LD die 20, corresponding to the sequence of current values. The photo detector 182 detects power of the light and outputs the power of the light to the power meter 184 in a form of electricity. The power meter 184 thus measures a sequence of power values corresponding to the sequence of current values.

The current source 14 includes two probes 144 for contacting electrodes of the LD die 20 and supplying the electric current through the probes 144. The voltage meter 142 is integrated in the current source 14. The sequence of voltages can also be measured through the probes 144.

In step 400, obtaining an electro-optical property of the LD die 20 based upon the sequence of current values, the sequence of voltage values, and the sequence of power values.

In step 500, determining if the LD die 20 is qualified according to the electro-optical property of the LD die 20.

In step 600, packaging the LD die 20 into the LD 20a if the LD die 20 is deemed to be qualified.

In step 700, rejecting the LD die 20. If the LD die 20 is deemed to be disqualified, the LD die 20 is rejected and not packaged.

As such, a quality of the LD 30 can be tested before being packaged and unqualified LD dies can be avoided from being package to save time and materials, thus reducing cost of the LD 30.

In this embodiment, the support 16 also includes a second cantilever 166 and a camera module 168. The second cantilever 166 also extends from the rotary plate 164. The camera module 168 is positioned on the second cantilever 166 and can be positioned to directly face the LD die 20 by rotating the rotary plate 164. The manufacturing method further includes the steps 23a-23b between the steps 200, 300.

In step 23a, capturing an image of the LD die 20 by the camera module 168. If it is determined that the cosmetic defects of the LD die 20 need to be detected, the camera module 168 is positioned to directly face the LD die 20 by rotating the rotary plate 164 and is actuated to capture the image of the LD die 20.

In step 23b, analyzing if the LD die 20 has cosmetic defects based upon the image of the LD die 20. If the LD die 20 has no cosmetic defects, the manufacturing method goes to step 300 and the current source 14 supplies the electric current to the LD die 20. Otherwise, the manufacturing method goes to step 700 and the LD die 20 is rejected and not packaged.

In other embodiments, the second cantilever 166 and the camera module 168 can be omitted and the steps 23a, 23b are omitted correspondingly.

The testing device 10 also includes a controller 10a electrically connected to the current source 14 and the optical power meter 18. The controller 10a is configured for controlling the current source 14 to supply the electric current and measure the sequence of voltage values, and the optical power meter 18 to measure the sequence of power values. The controller 10a is also configured for processing the sequence of current values, the sequence of voltage values, and the sequence of power values to obtain the electro-optical property of the LD die 20 in a form of, e.g., an electro-optical characteristic curve.

In other embodiments, the controller 10 can be omitted and the function is implemented by users.

Particular embodiments are shown here and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A testing device for a laser diode (LD), comprising:
a chuck for holding an LD die;

a current source for supplying electric current increasing with a fixed increment to the LD die to drive the LD die to emit light, the current source comprising a voltage meter, the electric current having a sequence of current values, the voltage meter being configured for metering a sequence of voltage values across the LD die, the sequence of voltage values corresponding to the sequence of current values, respectively;

a support positioned on the chuck and comprising a first cantilever extending above the chuck; and an optical power meter comprising a photo detector and a power meter; the photo detector being positioned on the first cantilever, facing the chuck, and configured for detecting power of the light emitted from the LD die, the power meter being electrically connected to the photo detector and configured for measuring a sequence of power values corresponding to the sequence of current values, respectively, an electro-optical property of the LD die being determined according to the sequence of current values, the sequence of voltage values, and the sequence of power values;

wherein the support comprises a rotary plate, the first cantilever extends from the rotary plate, and the photo detector is capable of being positioned to directly face the LD die by rotating the rotary plate.

2. The testing device of claim 1, wherein the support comprises a second cantilever and a camera module, the second cantilever extends from the rotary plate, the camera module is positioned on the second cantilever and can be positioned to directly face the LD die by rotating the rotary plate to capture an image of the LD die.

3. The testing device of claim 1, further comprising a controller electrically connected to the current source and the optical power meter, the controller being configured for controlling the current source to supply the electric current and measure the sequence of voltage values, and controlling the optical power meter to measure the sequence of power values, the controller being configured for processing the sequence of current values, the sequence of voltage values, and the sequence of power values to obtain the electro-optical property of the LD die.

* * * * *